United States Patent [19]

Nate et al.

[11] Patent Number: 4,504,646

[45] Date of Patent: Mar. 12, 1985

[54] POSITIVE TYPE, RADIATION-SENSITIVE ORGANIC POLYMER MATERIALS

[75] Inventors: Kazuo Nate, Machida; Takashi Inoue, Yokohama; Hitoshi Yokono, Fujisawa, all of Japan

[73] Assignee: Hitachi, Ltd., Tokyo, Japan

[21] Appl. No.: 550,200

[22] Filed: Nov. 9, 1983

[30] Foreign Application Priority Data

Nov. 15, 1982 [JP] Japan .................................. 57-198958

[51] Int. Cl.³ .............................................. C08G 77/06
[52] U.S. Cl. ......................................... 528/16; 528/10; 528/25; 528/270; 528/14; 528/19; 556/436

[58] Field of Search .................... 556/436; 528/10, 16, 528/25, 270, 14, 19

[56] References Cited

U.S. PATENT DOCUMENTS

| 2,588,083 | 3/1952 | Burkhard et al. | 556/436 |
| 2,989,559 | 6/1961 | Marsden | 556/436 |
| 4,424,392 | 1/1984 | Petty | 556/436 |

Primary Examiner—Melvyn I. Marquis
Attorney, Agent, or Firm—Antonelli, Terry & Wands

[57] ABSTRACT

Aliphatic aldehyde polymer containing at least one Si atom in its molecular chain is a positive type resist having a very high sensitivity to radiation such as electron beams, X-rays, ion beams, etc.

4 Claims, No Drawings

POSITIVE TYPE, RADIATION-SENSITIVE ORGANIC POLYMER MATERIALS

BACKGROUND OF THE INVENTION

1. Field of the Invention

This invention relates to positive type, radiation-sensitive, organic polymer materials suitable for forming a fine pattern, and more particularly to positive type, radiation-sensitive, organic polymer materials suitable for producing semi-conductor devices, magnetic bubble memory devices, integrated circuits, etc.

2. Description of the Prior Art

Recently, it has been required to form patterns having a width of less than 1 μm to produce semi-conductor devices, magnetic bubble memory devices, integrated circuits, etc. with a higher load density and a higher integration.

To meet such requirements, a lithographic technology using a high energy level radiation such as electron beams, X-rays, ion beams, etc. has been studied.

Radiation-sensitive, organic polymer materials for such application can be classified into the following two positive type and negative type groups:

(a) Positive type represented by poly-(methyl methacylate) and poly-(1-butenesulfone), where the irradiated area undergoes scission reaction and turns soluble in a developing solution.

(b) Negative type where the irradiated area undergoes cross-linking and turns insoluble in a developing solution.

Positive type, radiation-sensitive, organic polymer material has a higher resolving power than the negative type and thus is suitable for forming a finer pattern. However, the sensitivity of positive type is 1/10–1/100 of that of the negative type, and it takes longer time in forming a finer pattern [M. J. Bowden et al: Solid State Technology, Vol. 22, No. 5, pages 72–82 (1979)].

Furthermore, the conventional positive type and negative type, radiation-sensitive, organic polymer materials must be developed according to a wet process.

SUMMARY OF THE INVENTION

The object of the present invention is to provide positive type, radiation-sensitive, organic polymer materials having a high sensitivity to a high energy level radiation such as electron beams, X-rays, ion beams, etc. and a high resolving power and being capable of forming a finer pattern through scattering of irradiated area simultaneously with irradiation and requiring no special development.

The said object can be attained by increasing the absorbability of aldehyde polymer to radiation such as electron beams, X-rays, ion beams, etc. and increasing its solubility in an organic solvent.

More specifically, homopolymers of aliphatic aldehyde have a high crystalinity and are sparingly soluble in an organic solvent. Thus, the homopolymers of aliphatic aldehyde fail to serve as a resist material. It has been thus tried to improve the solubility of aldehyde polymers in an organic solvent to obtain polymers applicable as a resist material.

Aldehyde copolymers obtained by anion polymerization of a mixture containing at least two kinds of aliphatic aldehydes have an improved solubility, as compared with homopolymers, but the solubility is not always satisfactory for application as a resist material.

Aliphatic aldehydes having Si in their molecular chains have been studied. As a result, the present inventors have found that polymers represented by the following formula (1) or (2), obtained by homopolymerization of aliphatic aldehyde containing Si in its molecular chain or copolymerization thereof with aliphatic aldehyde have a distinguished solubility in an organic solvent and a high sensitivity to radiation and can be used as a resist material.

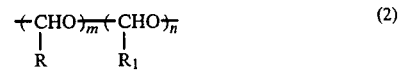

wherein R is an alkyl group having 1 to 8 carbon atoms, a halogenated alkyl group, an aralkyl group or a halogenated aralkyl group, each of the groups contains at least one Si atom in its molecular chain; $R_1$ is an alkyl group having 1 to 8 carbon atoms, a halogenated alkyl group, an aralkyl group or a halogenated aralkyl group.

Aliphatic aldehyde represented by

in the general formulas (1) and (2) includes, for example, β-trimethylsilylpropanal, β-triethylsilylpropanal, β-trimethylsilylbutanal, and β-triethylsilylbutanal, among which β-trimethylsilylpropanal is most preferable.

Aliphatic aldehyde represented by

in the general formula (2) includes, for example, ethanal, propanal, n-butanal, n-pentanal, n-hexanal, and β-phenylpropanal.

The polymer represented by the general formula (2) contains at least 10% by mole of aliphatic aldehyde

and less than 90% by mole of aliphatic aldehyde

when 100% by mole of monomer unit

is excluded.

Polymers represented by said general formula (1) or (2) can be obtained by anion polymerization. A catalyst can be used at the polymerization, and includes, for example, dimethylaluminum(diphenyl)amide, diethylaluminum(diphenyl)amide, ethylaluminum-bis(diphenyl)amide, ethylzinc(diphenyl)amide, ethylmagnesium(diphenyl)amide, etc. The catalyst is used in an amount of 0.1–5% by mole on the basis of monomers, and is used in a solution in a hydrocarbon solvent such as toluene, etc. or in an ether solvent such as ethylether, etc.

Polymerization is carried out at 0°–100° C., preferably 50°–80° C., in an inert gas atmosphere such as a nitrogen gas.

The present positive type, radiation-sensitive, organic polymer materials are dissolved in an organic solvent such as toluene, xylene, chloroform, etc. to make a resist. The resist can be applied to coating by a spinner or by dipping. The coating film is heated to an appropriate temperature to remove the solvent by volatilization. Then, the coating film is irradiated by a radiation in a desired pattern. The irradiated area is disintegrated in a chain reaction manner and scattered off, whereby a pattern can be obtained without any special developing step.

The present polymer materials can be also developed with a solvent mixture of toluene-isopropyl alcohol according to the wet process.

The present polymer materials are also photosensitive and can be used as a photosensitive material.

DETAILED DESCRIPTION OF THE PREFERRED EMBODIMENTS

The present invention will be described in detail below, referring to Preparatory Examples and Examples.

PREPARATORY EXAMPLE 1

Synthesis of diethylaluminum diphenylamide $(C_2H_5)_2Al-N(C_6H_5)_2$ was prepared in the following manner:

After a four-necked flask having a net capacity of 200 ml with a stirrer, a dropping funnel, a three-way cock, and a thermometer was thoroughly flushed with nitrogen, 33 ml of toluene and 14.5 g (0.127 moles) of $(CH_3CH_2)_3Al$ were introduced into the flask in a nitrogen gas stream through the three-way cock by a syringe.

After the mixture was stirred for a while to obtain a uniform solution, a solution of 21.4 g (0.127 moles) of diphenylamine in 40 ml of toluene was slowly added to the first solution dropwise with ice cooling. After the dropwise addition, the reaction mixture was heated to 60° C., and gently stirred at that temperature for 2 hours to complete the reaction.

The thus formed $(C_2H_5)_2Al-N(C_6H_5)_2$ was preserved as it was in the toluene solution in a container with a three-way cock in a nitrogen gas stream.

PREPARATORY EXAMPLE 2

β-trimethylsilylpropanal, an aldehyde monomer containing a silicon atom was prepared in the following manner.

At first, 300 ml of tetrahydrofuran, 3.04 g (0.44 moles) of finely milled lithium, and 54.25 g (0.5 moles) of trimethylsilyl chloride were placed in a 4-necked flask having a net capacity of 500 ml with a stirrer, a dropping funnel, a thermometer and a cooling pipe, and 11.2 g (0.2 moles) of acrolein was added thereto with stirring over about one hour, while keeping the liquid temperature at 0° C. Then, the mixture was continuously stirred at room temperature for 15 hours.

After the end of reaction, lithium and lithium chloride were removed therefrom by filtration, and tetrahydrofuran and excess methylsilyl chloride were removed therefrom by distillation. By distillation under reduced pressure, $(CH_3)_3-SiCH_2-CH=CHO-Si(CH_3)_3$ was obtained (boiling point: 100° C./30 mmHg), and this compound was then left standing in HCl-acetone for one hour to effect hydrolysis, and distilled under reduced pressure, whereby β-trimethylsilylpropanal was obtained (boiling point: 60° C./30 mmHg).

PREPARATORY EXAMPLES 3–5

Polymerization was conducted in a polymerization tube with a three-way cock. That is, predetermined amounts of aldehyde monomer and a solvent (usually toluene) were introduced into a cylindrical polymerization vessel having a net capacity of about 100 ml in a nitrogen gas stream through the three-way cock by a sylinge.

The said vessel containing the monomer solution was cooled to 0° C. in an ice-water bath, and a predetermined amount of the catalyst solution prepared in Preparatory Example 1 was slowly added to the vessel, while vigorously shaking the vessel.

After the addition of the catalyst, the vessel was cooled to −78° C. in a dry ice-acetone bath and left standing for a predetermined time to effect polymerization. After the end of polymerization, the polymerization mixture was treated with ammoniacal methanol to decompose the catalyst, and then dipped in methanol for one day, then separated by filtration, washed several times with methanol, and dried in vacuum.

In some cases, the monomer solution was added to the catalyst solution to effect polymerization.

Polymers of various compositions thus prepared are shown in Table 1.

Composition of copolymers was determined by elemental analysis or from composition analysis of a gas generated by thermal analysis.

TABLE 1

| Preparatory Example No. | Composition of charged monomer (parts by mole) | Yield Polymerization (%) | Polymer composition (% by mole of TMS-PA) | General formula of polymer |
| --- | --- | --- | --- | --- |
| 3 | TMS-PA(100) | 45 | 100 | $+CHO+_m$<br>$\|$<br>$CH_2CH_2Si(CH_3)_3$ |
| 4 | TMS-PA(50)-BA(50) | 48 | 45 | $+CHO+_m \quad\quad +CHO+_n$<br>$\|\quad\quad\quad\quad\quad\quad\quad \|$<br>$CH_2CH_2Si(CH_3)_3 \quad C_3H_7$ |

TABLE 1-continued

| Preparatory Example No. | Composition of charged monomer (parts by mole) | Yield Polymerization (%) | Polymer composition (% by mole of TMS-PA) | General formula of polymer |
|---|---|---|---|---|
| 5 | TMS-PA(50)-PA(50) | 48 | 45 | $\text{+CHO+}_m\text{——+CHO+}_n$ <br> $\vert$ <br> $CH_2CH_2Si(CH_3)_3 \quad C_2H_5$ |

Polymerization time: 24 hours
Total amount of monomers: 100 m mole
Solvent: toluene
Total amount of reaction mixture: 27 ml
Initiator: $(C_2H_5)_2Al\ N(C_6H_5)_2$ 0.18 m moles
Symbols for monomers:
 TMS-PA: β-trimethylsilylpropanal
 BA: butyl aldehyde
 PA: propanal

EXAMPLE 1

Polymers of β-trimethylsilylpropanal obtained in Preparatory Example 3 were dissolved in chloroform to prepare a 0.2 wt.% resist solution. Then, the said resist solution was applied onto a silicon wafer and prebaked at 80° C. for 20 minutes to form a polymer film having a thickness of 0.3 μm. Then, the silicon wafer was placed in an electron beam irradiator and subjected to irradiation with locally different irradiation dosages by electron beams of acceleration voltage of 20 kV in vacuum. As a result, the irradiated area was thinned without applying any developing treatment, and thickness of residual polymer film was measured at the irradiated area with different irradiation dosages by means of a Taly step film thickness gage. The residual film thickness (normalized) was plotted against irradiation dosage of electron beam (coulomb/cm²) to obtain an irradiation characteristic curve showing an electron beam-sensitive characteristic.

A minimum irradiation dosage at which the residual film ratio is zero was obtained from the curve. It was $8 \times 10^{-7}$ coulomb/cm². It was found that the present resist was a positive type resist with a very high sensitivity. For example, the electron beam sensitivity of polymethyl methacrylate as a typical positive type resist is $1 \times 10^{-4}$ coulomb/cm², and it was found that the present positive type resist has a higher sensitivity at least by two digits than polymethyl methacrylate.

EXAMPLE 2

Copolymer of β-trimethylsilylpropanal with butylaldehyde prepared in Preparatory Example 4 was dissolved in toluene to prepare a 1 wt.% resist solution. Then, the resist solution was applied to a silicon wafer and prebaked at 80° C. for 20 minutes to obtain a polymer film having a thickness of 2 μm. Then, the silicon wafer was placed in a soft X-ray generator and irradiated with soft X-rays having a wavelength of 4.2 Å generated from a rotary, water-cooled silver target of 10 kW in vacuum. Relationship between the residual film thickness (normalized) and soft X-rays irradiation dosage (mJ/cm²) was determined, and a minimum irradiation dosage at which the film thickness was zero was found to be 10 mJ/cm². It was found that the present resist was a positive type resist having a very high sensitivity.

EXAMPLES 3-7

Aldehyde copolymers prepared in the similar manner to that of Preparatory Examples 4 and 5 were each dissolved separately in xylene to prepare approximately 1 wt.% resist solutions. The resist solutions were each applied to silicon wafers and prebaked at 80° C. for 20 minutes to obtain polymer films having a thickness of about 2 μm. Then, the wafers were irradiated with an electron beam of acceleration voltage of 20 kV or soft X-rays (AlKα, MoLα or AgLα) of 10 kW to obtain an electron beam sensitivity or a soft X-rays sensitivity. The results are summarized in Table 2. It was found that all of the present resists had a high sensitivity to radiation and were positive type resists having a high sensitivity.

TABLE 2

| Example No. | Radiation-sensitive polymer material (parts by mole) | Electron beam sensitivity (C/cm²) or soft X-rays sensitivity (mJ/cm²) |
|---|---|---|
| 3 | TMS-PA(45)-BA(55) | 10 mJ/cm² (MoLα) |
| 4 | " | 20 mJ/cm² (AlKα) |
| 5 | TMS-PA(45)-PA(55) | $9 \times 10^{-7}$ C/cm² |
| 6 | " | 18 mJ/cm² (MoLα) |
| 7 | " | 10 mJ/cm² (AgLα) |

TMS-PA: β-trimethylsilylpropanal
BA: butylaldehyde
PA: propanol

COMPARATIVE EXAMPLE

Homopolymer of acetaldehyde and homopolymer of butylaldehyde were tested in the same manner as in Example 1 to evaluate their applicability as resist material, but no resist materials that are soluble in the ordinary organic solvents were obtained. That is, they were not practically applicable.

What is claimed is:

1. A positive type, radiation-sensitive polymer which comprises an aliphatic aldehyde polymer having at least one Si atom in its molecular chain, represented by the general formula (1) or (2):

(1)

or

(2)

wherein R is an alkyl group having 1 to 8 carbon atoms, a halogenated alkyl group, an aralkyl group or a halogenated aralkyl group, each of the groups contains at least one Si atom in its molecular chain at the β-position, and $R_1$ is an alkyl group having 1 to 8 carbon atoms, a halogenated alkyl group, an aralkyl group or a halogenated aralkyl group and m/n is 0.45/0.55.

2. A positive type, radiation-sensitive polymer according to claim 1, wherein an aliphatic aldehyde unit represented by

in the formula (1) or (2) is obtained from β-trimethylsilylpropanal, β-triethylsilylpropanal, β-trimethylsilylbutanal or β-triethylsilylbutanal, and aliphatic aldehyde unit represented by

in the formula (2) is obtained from ethanal, propanal, n-butanal, n-pentanal, n-hexanal, or β-phenylpropanal.

3. A radiation-sensitive polymer having (a) 10 to 100% by mole of one or more repeating units of a formula (1):

wherein R is an alkyl group having 1 to 8 carbon atoms, a halogenated alkyl group, an aralkyl group or a halogenated aralkyl group, each of the groups contains at least one Si atom, and (b) 90 to 0% by mole of one or more repeating units of a formula (2):

wherein $R_1$ is an alkyl group having 1 to 8 carbon atoms, a halogenated alkyl group, an aralkyl group or a halogenated aralkyl group.

4. A radiation-sensitive polymer according to claim 3, wherein the repeating unit represented by the formula (1) is any one of

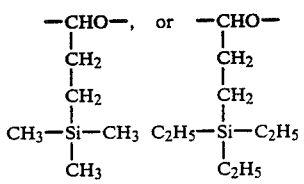

and the repeating unit represented by the formula (2) is any one of

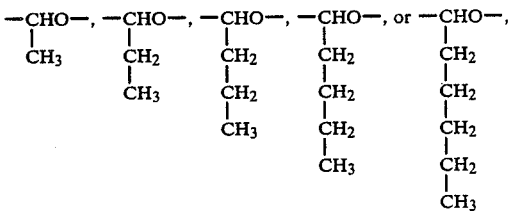

* * * * *